(12) United States Patent
Puri et al.

(10) Patent No.: US 6,898,143 B2
(45) Date of Patent: May 24, 2005

(54) SHARING FUSE BLOCKS BETWEEN MEMORIES IN HARD-BISR

(75) Inventors: Mukesh K. Puri, Fremont, CA (US); Ghasi R. Agrawal, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 189 days.

(21) Appl. No.: 10/647,993

(22) Filed: Aug. 26, 2003

(65) Prior Publication Data

US 2005/0047253 A1 Mar. 3, 2005

(51) Int. Cl.[7] ............................................... G11C 7/00
(52) U.S. Cl. ............................. 365/225.7; 365/230.03
(58) Field of Search .......................... 365/225.7, 230.03

(56) References Cited

U.S. PATENT DOCUMENTS

| 5,892,718 | A | * | 4/1999 | Yamada | ...................... 365/200 |
| 5,912,841 | A | * | 6/1999 | Kim | ...................... 365/185.09 |
| 6,205,063 | B1 | * | 3/2001 | Aipperspach et al. | ....... 365/200 |

* cited by examiner

Primary Examiner—Richard Elms
Assistant Examiner—Pho M. Luu
(74) Attorney, Agent, or Firm—Trexler, Bushnell, Giangiorgi & Blackstone, LTD

(57) ABSTRACT

A BISR scheme which provides that fuse blocks are shared between memories to reduce hard-BISR implementation costs. The scheme includes a plurality of memories serially connected to a fuse controller. A plurality of fuse blocks are also serially connected to the fuse controller. There are more memory instances than there are fuse blocks, and the fuse controller is configured to allow the fuse blocks to be shared between memories. Preferably, each fuse block includes fuse elements which can be programmed with the memory instance number which needs to be repaired. The fuse block reduces routing congestion and is preferably configured to provide the flexibility of assigning any fuse block to any instance that needs repair. The programmable fuse elements are preferably loaded into a counter (which is preferably part of the fuse controller) which ensures that the correct block information gets loaded into the corresponding memory instance.

24 Claims, 4 Drawing Sheets

SHARING FUSE BLOCKS BETWEEN MEMORIES IN HARD-BISR

BACKGROUND OF THE INVENTION

The present invention generally relates to Built-in-Self-Repair (BISR) schemes, and more specifically relates to memories and fuse blocks.

Built-in-Self-Repair (BISR) is a scheme wherein a certain amount of redundant elements are provided in each memory so that random process defects do not cause excessive yield loss. The current versions of BISR run different patterns at wafer-level to test the memories on the chip and generate a repair solution which can be scanned out of the chip and written to an output file. The repair solutions are then programmed on the respective devices by blowing fuses. In the system, a power-on state machine loads the fuse values into the memories. This repairs the memories (i.e., soft-repair) after which they can be accessed in the functional mode.

FIG. 1 illustrates the structure of a hard-BISR scheme which is currently in use, while FIG. 2 illustrates the method steps of its usage. The scheme provides that memories 30 ("Mem-1", "Mem-2", . . . "Mem-100") are provided on a core 32 which is on a chip 34, and provides that fuse blocks 36 ("B1-1", "B1-2", . . . "B1-100") are provided on the chip 34 and are connected to the memories 30 via routing 38. The scheme provides that there is one fuse block for each repairable memory instance (i.e., fuse block "B1-1" is routed to memory "Mem-1", fuse block "B1-2" is routed to memory "Mem-2" . . . fuse block "B1-100" is routed to memory "Mem-100"). FIG. 1 shows the specific example where there are 100 memories and 100 fuse blocks. Each of the blocks contains a number of fuses which can be blown to program the repair solution for each memory. The size of these blocks is a function of the amount of redundancy available. For example, a given memory instance with 4 redundant rows needs about 52 fuses and would be (48u× 287u) in size. However, these fuse blocks are an overhead in terms of Silicon area utilization and can cause complications in layout and routability of the design. Moreover, in the majority of repairable devices, only a few of the memory instances actually need repair. Therefore, the bulk of the fuse blocks are left unused.

OBJECTS AND SUMMARY OF THE INVENTION

An object of am embodiment of the present invention is to provide a BISR scheme which provides that fuse blocks are shared between memories to reduce hard-BISR implementation costs.

Another object of am embodiment of the present invention is to provide a BISR scheme which saves Silicon area and reduced complications in routing and layout.

Briefly, and in accordance with at least one of the foregoing objects, an embodiment of the present invention provides a BISR scheme which includes a plurality of memories serially connected to a fuse controller. A plurality of fuse blocks are also serially connected to the fuse controller. There are more memory instances than there are fuse blocks, and the fuse controller is configured to allow the fuse blocks to be shared between memories to reduce hard-BISR implementation costs. Preferably, each fuse block includes fuse elements which can be programmed with the memory instance number which needs to be repaired. The fuse block reduces routing congestion and is preferably configured to provide the flexibility of assigning any fuse block to any instance that needs repair. The programmable fuse elements are preferably loaded into a counter (which is preferably a part of the fuse controller) which ensures that the correct block information gets loaded into the corresponding memory instance.

BRIEF DESCRIPTION OF THE DRAWINGS

The organization and manner of the structure and operation of the invention, together with further objects and advantages thereof, may best be understood by reference to the following description, taken in connection with the accompanying drawing, wherein.

DESCRIPTION

Figure 1:
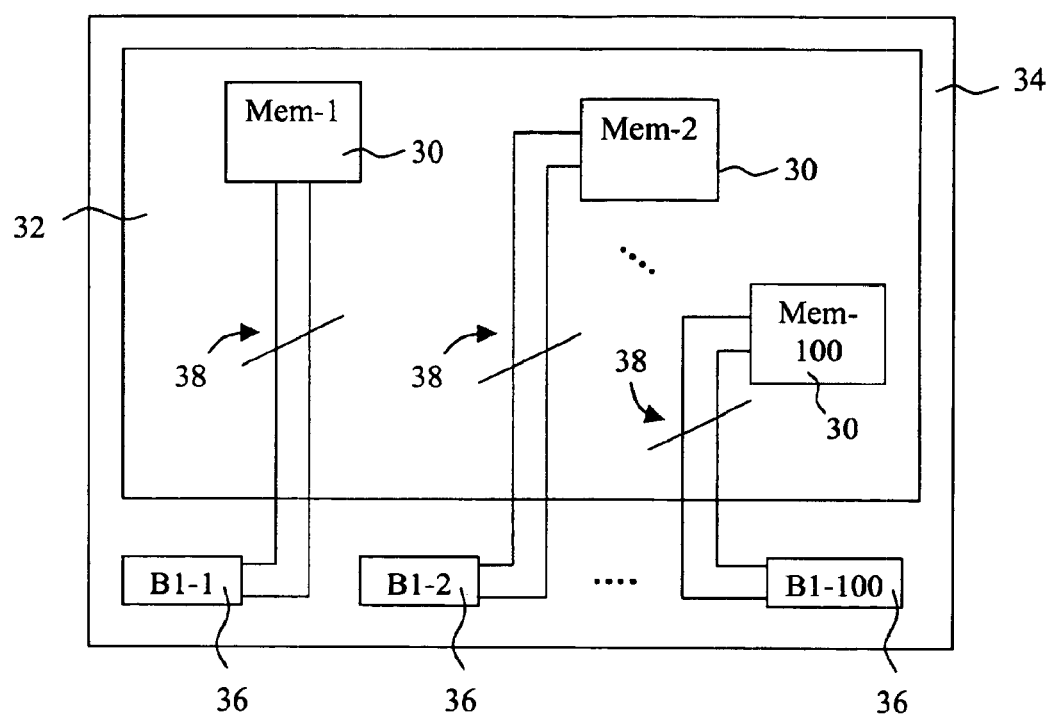
FIG. 1 illustrates the structure of a prior art BISR scheme.
Figure 2:
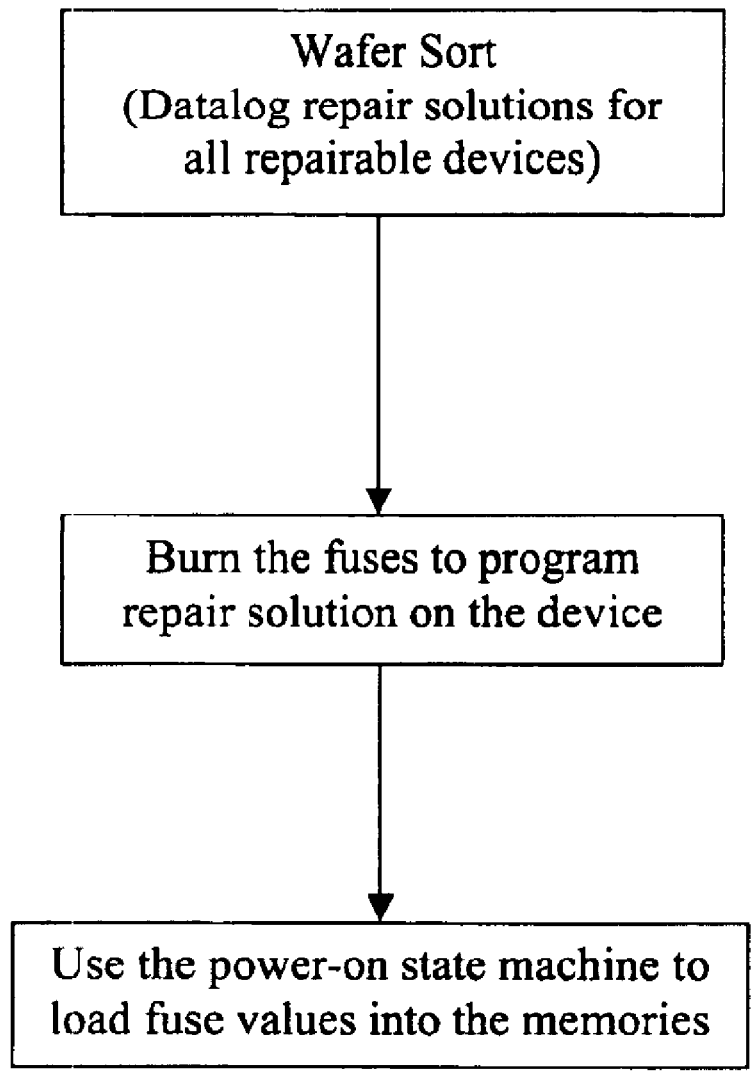
FIG. 2 illustrates usage of the prior art BISR scheme shown in FIG. 1.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Figure 3:
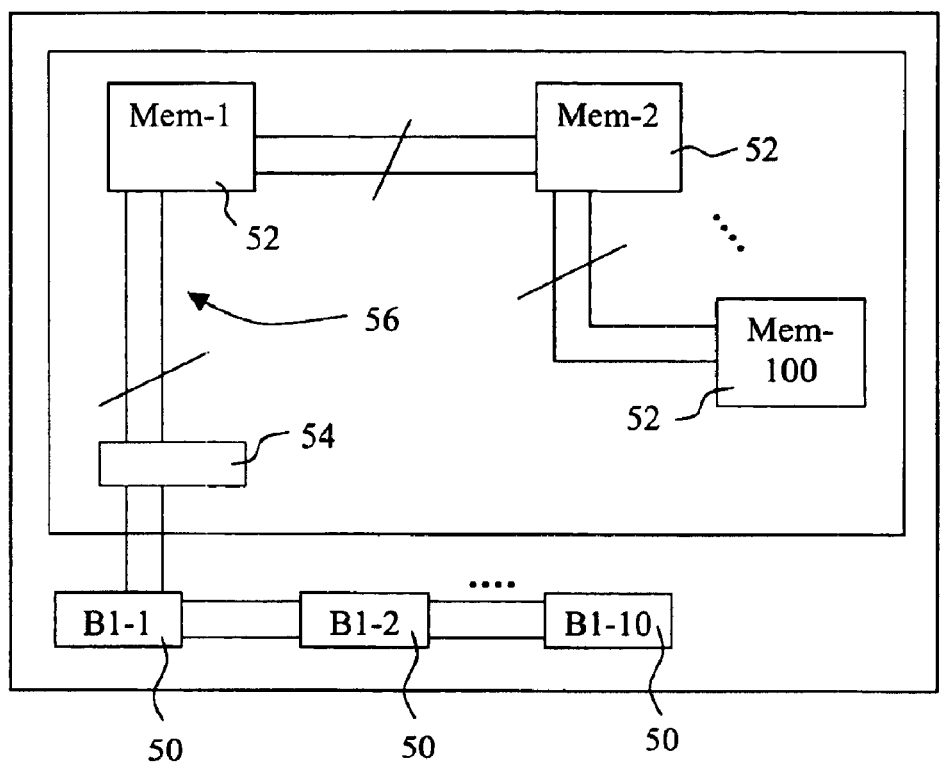
FIG. 3 illustrates the structure of a BISR scheme which is in accordance with an embodiment of the present invention.
Figure 4:
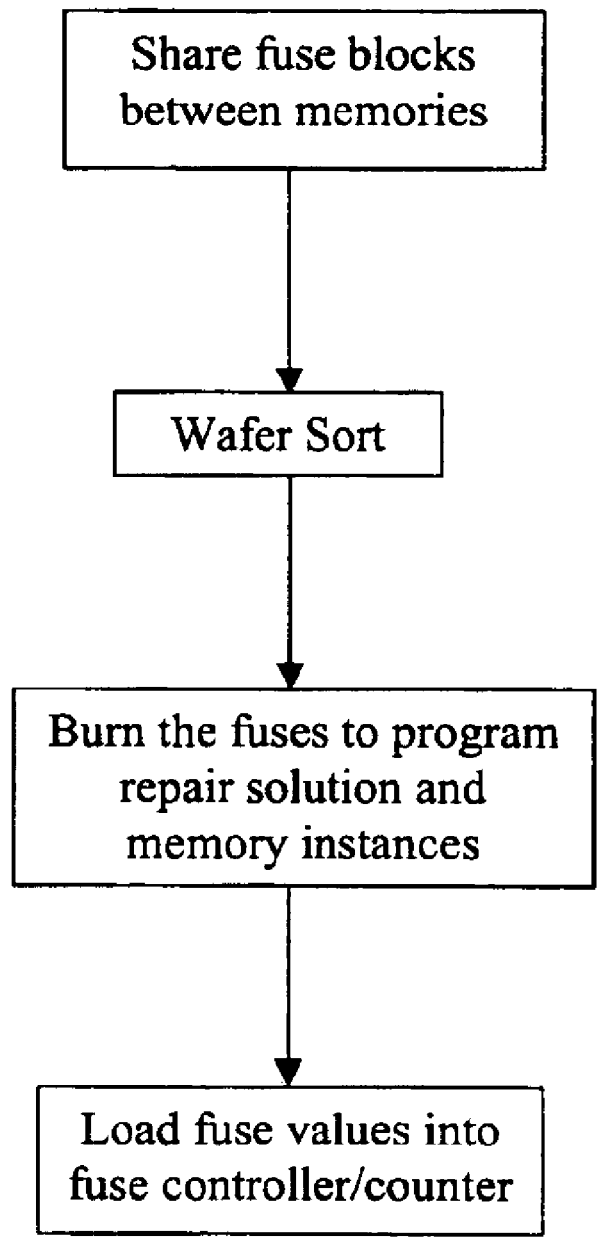
FIG. 4 illustrates usage of the BISR scheme shown in FIG. 3.

FIG. 3 illustrates the structure of a BISR scheme which is in accordance with an embodiment of the present invention, and FIG. 4 illustrates its usage. The scheme provides that fuse blocks 50 ("B1-1", "B1-2", . . . "B1-10") are shared between memories 52 ("Mem-1", "Mem-2", . . . "Mem-100") to reduce hard-BISR implementation costs. The scheme saves Silicon area and reduced complications in routing and layout.

The scheme includes a plurality of memories 52 ("Mem-1", "Mem-2", . . . "Mem-100") which are serially connected to a fuse controller 54, and a plurality of fuse blocks 50 ("B1-1", "B1-2", . . . "B1-10") are also serially connected to the fuse controller. There are more memory instances (a quantity of 100 in FIG. 3) than there are fuse blocks (a quantity of ten in FIG. 3), and the fuse controller 54 is configured to allow the fuse blocks 50 to be shared between memories 52. Preferably, each fuse block 50 includes fuse elements which can be programmed with the memory instance number which needs to be repaired. The fuse block reduces routing congestion and is preferably configured to provide the flexibility of assigning any fuse block to any instance that needs repair. The programmable fuse elements are preferably loaded into a counter (which is preferably a part of the fuse controller 54) which ensures that the correct block information gets loaded into the corresponding memory instance. As such, the fuse controller 54 is configured to regulate the scan-in sequence, and the connection 56 from the fuse controller 54 to the chain of memories 52 provides the routing for fuse information. While the example shown in FIG. 3 provides one hundred memories, one fuse controller, and ten fuse blocks, other quantities may be provided depending on the structure and application.

Compared to FIG. 1, the individual fuse block size of the scheme shown in FIG. 3 can be increased to allow for additional fuse elements which can be programmed with the memory instance number which needs to be repaired. For example, a design with 100 memory instances may have only 10 fuse blocks as per the scheme shown in FIG. 3 versus 100 blocks required under the scheme shown in FIG. 1. Preferably, each of the fuse blocks has some additional fuse elements (such as 7 in the particular example depicted in FIG. 3) to program which memory instance would get loaded from that specific block. As discussed, the fuse blocks are serially connected to all memories through the fuse controller which reduces routing congestion and provides the flexibility of assigning any block to any instance that needs repair. The additional fuse elements are loaded into a counter (which is preferably part of the fuse controller) which ensures that the correct block information gets loaded into the corresponding memory instance.

FIGS. 1 and 3 basically show the differences between the currently, widely used BISR scheme and a BISR scheme which is in accordance with an embodiment of the present invention. The notations "Mem-1", "Mem-2", . . . "Mem-100" in these figures indicate the memory instances along with the BIST (Built-In Self-Test) and BISR logic, while "B1-1", "B1-2", . . . "B1-100" (in FIG. 1) and "B1-1", "B1-2", . . . "B1-10" (in FIG. 3) show the fuse blocks. Again, while FIG. 1 shows 100 memories and 100 fuse blocks, and FIG. 3 shows 100 memories, one fuse controller, and 10 fuse blocks, other quantities are possible.

While an embodiment of the present invention is shown and described, it is envisioned that those skilled in the art may devise various modifications of the present invention without departing from the spirit and scope of the appended claims.

What is claimed is:

1. A BISR scheme comprising:
   a fuse controller;
   a plurality of memories connected to the fuse controller;
   a plurality of fuse blocks connected to the fuse controller, said BISR scheme configured such that said memories share said fuse blocks, said BISR scheme configured to perform a wafer sort.

2. A BISR scheme as recited in claim 1, wherein the memories are serially connected to the fuse controller.

3. A BISR scheme as recited in claim 1, wherein the fuse blocks are serially connected to the fuse controller.

4. A BISR scheme as recited in claim 1, wherein the memories are serially connected to the fuse controller and the fuse blocks are serially connected to the fuse controller.

5. A BISR scheme as recited in claim 1, wherein there are more memories than fuse blocks.

6. A BISR scheme as recited in claim 1, wherein the fuse controller is configured to program memory addresses into the fuse blocks.

7. A BISR scheme as recited in claim 1, wherein the fuse controller is configured to program memory addresses and repair solutions into the fuse blocks.

8. A method of implementing a BISR scheme comprising:
   providing a fuse controller, a plurality of memories connected to the fuse controller, and a plurality of fuse blocks connected to the fuse controller; and
   having the memories share the fuse blocks, further comprising performing a wafer sort.

9. A method as recited in claim 8, further comprising burning the fuse blocks to program a repair solution and memory addresses.

10. A method as recited in claim 9, further comprising loading the repair solution and memory addresses into the fuse controller.

11. A method as recited in claim 8, further comprising loading fuse values into the fuse controller.

12. A BISR scheme comprising:
   a fuse controller;
   a plurality of memories connected to the fuse controller;
   a plurality of fuse blocks connected to the fuse controller, said BISR scheme configured such that said memories share said fuse blocks, wherein the memories are configured in a serial chain, wherein one of the memories is connected to the fuse controller and the other memories are serially connected to each other and to the memory which is connected to the fuse controller.

13. A BISR scheme as recited in claim 12, wherein the fuse blocks are configured in a serial chain, wherein one of the fuse blocks is connected to the fuse controller and the other fuse blocks are serially connected to each other and to the fuse block which is connected to the fuse controller.

14. A BISR scheme as recited in claim 12, wherein there are more memories than fuse blocks.

15. A BISR scheme as recited in claim 12, wherein there fuse controller is configured to program memory addresses into the fuse blocks.

16. A BISR scheme as recited in claim 12, wherein there fuse controller is configured to program memory addresses and repair solutions into the fuse blocks.

17. A BISR scheme as recited in claim 12, wherein the BISR scheme is configured to perform a wafer sort.

18. A method of implementing a BISR scheme comprising:
   providing a fuse controller, a plurality of memories connected to the fuse controller, and a plurality of fuse blocks connected to the fuse controller; and
   having the memories share the fuse blocks such that the memories are configured in a serial chain, wherein one of the memories is connected to the fuse controller and the other memories are serially connected to each other and to the memory which is connected to the fuse controller.

19. A method as recited in claim 18, further comprising providing that the fuse blocks are configured in a serial chain, wherein one of the fuse blocks is connected to the fuse controller and the other fuse blocks are serially connected to each other and to the fuse block which is connected to the fuse controller.

20. A method as recited in claim 18, further comprising providing that there are more memories than fuse blocks.

21. A method as recited in claim 18, further comprising burning the fuse blocks to program a repair solution and memory addresses.

22. A method as recited in claim 21, further comprising loading the repair solution and memory addresses into the fuse controller.

23. A method as recited in claim 18, further comprising loading fuse values into the fuse controller.

24. A method as recited in claim 18, further comprising performing a wafer sort.

* * * * *